United States Patent
Ueno et al.

(10) Patent No.: US 10,520,153 B2
(45) Date of Patent: Dec. 31, 2019

(54) LIGHT SOURCE MODULE, ILLUMINATION DEVICE AND MOVING BODY

(71) Applicant: PANASONIC INTELLECTUAL PROPERTY MANAGEMENT CO., LTD., Osaka (JP)

(72) Inventors: Yasuharu Ueno, Osaka (JP); Yoshihiko Kanayama, Hyogo (JP); Hiroya Tsuji, Kyoto (JP); Tomoyuki Ogata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/903,512

(22) Filed: Feb. 23, 2018

(65) Prior Publication Data
US 2018/0245758 A1    Aug. 30, 2018

(30) Foreign Application Priority Data

Feb. 27, 2017    (JP) .................................. 2017-035229

(51) Int. Cl.
| | |
|---|---|
| *F21S 41/153* | (2018.01) |
| *F21V 23/00* | (2015.01) |
| *H01L 25/13* | (2006.01) |
| *H01L 33/48* | (2010.01) |
| *F21Y 115/10* | (2016.01) |
| *F21W 107/30* | (2018.01) |
| *F21W 107/10* | (2018.01) |
| *F21W 107/13* | (2018.01) |
| *H01L 33/62* | (2010.01) |

(52) U.S. Cl.
CPC .......... *F21S 41/153* (2018.01); *F21V 23/001* (2013.01); *H01L 25/13* (2013.01); *H01L 33/483* (2013.01); *F21W 2107/10* (2018.01); *F21W 2107/13* (2018.01); *F21W 2107/30* (2018.01); *F21Y 2115/10* (2016.08); *H01L 33/62* (2013.01)

(58) Field of Classification Search
None
See application file for complete search history.

(56) References Cited

U.S. PATENT DOCUMENTS

| | | | |
|---|---|---|---|
| 2013/0188394 A1* | 7/2013 | Horikawa | F21V 21/00 362/613 |
| 2016/0126434 A1* | 5/2016 | Nakabayashi | F21S 41/663 315/82 |
| 2017/0328531 A1* | 11/2017 | Weber | F21S 41/663 |

FOREIGN PATENT DOCUMENTS

JP    2008-218674    9/2008

\* cited by examiner

*Primary Examiner* — Elmito Breval
(74) *Attorney, Agent, or Firm* — Greenblum & Bernstein, P.L.C.

(57) ABSTRACT

A light source module includes: a substrate; and multiple light sources mounted on a first surface of the substrate in a thickness direction of the substrate in a matrix. The light sources include a set of light sources arranged in a row direction and a set of light sources arranged in a column direction. Each of the light sources includes a first electric supply pad and a second electric supply pad. A first electric supply wire extends along the column direction and supplies electricity to each of the first electric supply pads. Second electric supply wires extend in the column direction and supply electricity to each of the second electric supply pads. Portions of light sources arranged in the column direction overlap at least one of the second electric supply wires and first electric supply pads.

18 Claims, 5 Drawing Sheets

LIGHT SOURCE MODULE, ILLUMINATION DEVICE AND MOVING BODY

CROSS REFERENCE TO RELATED APPLICATION

The entire disclosure of Japanese Patent Application No. 2017-035229 filed on Feb. 27, 2017 including specification, claims, drawings and abstract is incorporated herein by reference in its entirety.

TECHNICAL FIELD

The present disclosure relates to a light source module, an illumination device and a moving body.

BACKGROUND

Conventionally, there is known a light source module including a light source array in which a plurality of light sources are arranged in a matrix. For example, Patent Literature 1 discloses a light-emitting display device that two-dimensionally arrays light-emitting units including light-emitting diodes (LEDs) and formed in a dotted manner and that configures and displays a desired letter, symbol or drawing pattern while arbitrarily combining the displays of the units. The light-emitting display device in Patent Literature 1 is provided with a wiring substrate in which electric supply wires to the LEDs are formed on both surfaces of the substrate and in which a through-hole passing through the substrate in the thickness direction is formed for each light-emitting unit.

CITATION LIST

Patent Literature

[Patent Literature 1] JP 2008-218674 A

SUMMARY

Technical Problem

By the way, in the light source module including the light source array, in the case of a configuration in which the plurality of light sources can be individually controlled to be lit, it is necessary to provide the same number of electric supply wires as the number of the light sources, on at least one of the plus side and the minus side. Meanwhile, in the light source module, there is a demand to reduce the interval between the light sources and array many light sources in a high density, and therefore, it is difficult to provide a large wiring space.

Solution to Problem

A light source module in an aspect of the present disclosure includes: a substrate, a plurality of light sources mounted on a first surface of the substrate in a thickness direction of the substrate, arranged in a matrix, includes a set of light sources arranged in a row direction and a set of light sources arranged in a column direction, each of the plurality of light sources including a first electric supply pad and a second electric supply pad, the first electric supply pad being longer than the second electric supply pad in the row direction, and the each of the plurality of light sources is configured to be individually controlled to be lit, a first electric supply wire configured to supply electricity to each of the first electric supply pads, the first electric supply wire being provided to extend along the column direction, and a plurality of second electric supply wires configured to supply electricity to each of the second electric supply pads, each of the plurality of second electric supply wires being provided to extend along the column direction closer to a second surface of the substrate than the first electric supply wire, the second surface being located opposite of the first surface, wherein at least one of the plurality of second electric supply wires over laps, in the thickness direction, light sources among the set of light sources arranged in the column direction, and regions of the light sources overlapped by the at least one of the plurality of the second electric supply wires overlap one or more first electric supply pads of one or more of the light sources among the set of light sources arranged in the column direction.

An illumination device in an aspect of the present disclosure includes the above light source module. A moving body in an aspect of the present disclosure includes the above light source module.

Advantageous Effects of Invention

According to an aspect of the present disclosure, it is possible to provide a light source module in which the plurality of light sources constituting the light source array can be individually controlled to be lit and in which the plurality of light sources are arrayed in a matrix and in a high density, According to the light source module in an aspect of the present disclosure, it is possible to form runny wires while saving space, and for example, it is possible to form the same number of electric supply wires as the number of the light sources, in an identical layer.

BRIEF DESCRIPTION OF DRAWINGS

Embodiments of the present disclosure will be described based on the following figures, wherein.

DESCRIPTION OF EMBODIMENTS

Hereinafter, exemplary embodiments of a light source module, an illumination device and a moving body according to the present disclosure will be described in detail with reference to the drawings. The reference drawings in the description of the embodiments are schematic drawings, and therefore, the dimensional ratio of each constituent element, and the like should be determined in consideration of the following description. In the present specification, the expression of "nearly", for example, the expression of "nearly parallel" is intended to include not only a perfectly parallel state but also a state that is regarded as being substantially parallel.

In the description of the embodiments, a headlight 2 of an automobile will be exemplified as an illumination device on which a light source module according to the present disclosure is mounted, and the illumination device in the present disclosure is not limited this. The illumination device in the present disclosure may be an illumination device for apparatuses such as a display, a projector and a signal, may be an illumination device for facilities such as a house, a store, an office, a factory, a commercial facility, a public facility and an outdoor facility, or may be an illumination device for moving bodies other than the headlight of the automobile.

As the moving body on which the light source module according to the present disclosure is mounted, an automobile 1 including the headlight 2 is exemplified, but the moving body in the present disclosure is not limited to automobiles. The moving body in the present disclosure may be a hike, a railway vehicle, an airplane, a helicopter, a ship, a bicycle or the like.

Figure 1:
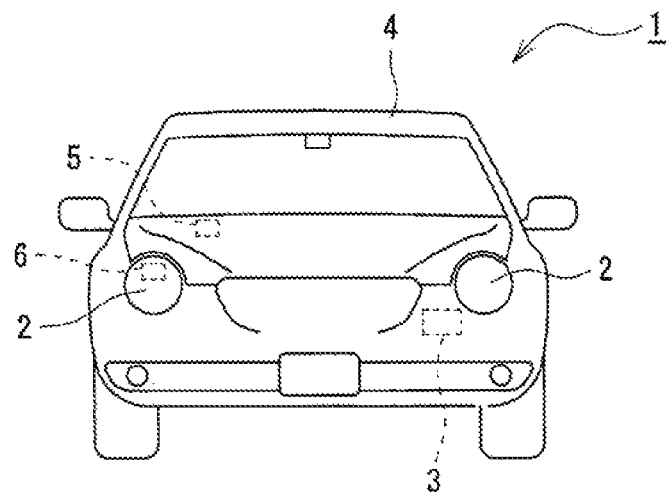
FIG. 1 is a front view of a moving body according to an exemplary embodiment.

FIG. 1 is a front view of the automobile 1 according to an exemplary embodiment. As illustrated in FIG. 1, the automobile 1 includes headlights 2 and a battery 3 fix supplying electric power to the headlights 2. At a front end portion of a vehicle body 4, the headlights 2 are provided on both sides of the width direction of the vehicle body 4, respectively. The automobile 1 includes a switch 5 for turning the headlights 2 on/off, and a drive circuit 6 that controls the action of the headlights 2. Generally, the switch 5 is disposed at a driver seat, and is operated by a driver. However, the headlight 2 may be automatically turned on/off, using an illumination sensor or the like.

The drive circuit 6 is disposed at the headlight 2 or near the headlight 2. In addition to the on/off control of the headlights 2 based on the operation of the switch 5 or the like, the drive circuit 6 may execute the light modulation, color toning and others of the headlights 2. The drive circuit 6 receives a control command, for example, from a vehicle control system (not illustrated) that controls the whole of the automobile 1, and controls the action of the headlights 2 based on the control command.

Figure 2:
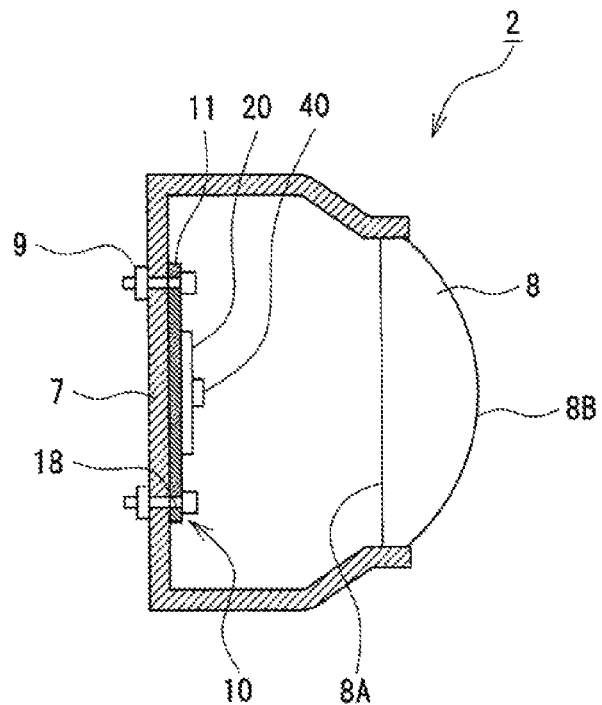
FIG. 2 is a sectional view of an illumination device according to an exemplary embodiment.

FIG. 2 is a sectional view of the headlight 2 according to an exemplary embodiment. As illustrated in FIG. 2, the headlight 2 includes a cylindrical case 7, a projection lens 8 attached to one end portion in the axial direction of the case 7, a light source module 10 arranged in the case 7. The light source module 10, which includes a light source array 40, is arranged in the case 7 while the light source array 40 is oriented to the side of the projection lens 8. The light source array 40 includes a plurality of light sources 41 that are arranged on a first surface of a primary wiring substrate 20 in a matrix (see FIG. 3 and the like). Preferably, a light source 41 should be a semiconductor light-emitting element, and particularly, should be a light-emitting diode (LED). Hereinafter, the description will be made on the assumption that the light source 41 is an LED.

The case 7, for example, has a bottomed cylindrical shape in which one end in the axial direction is opened. The shape of the projection lens 8 is not particularly limited. FIG. 2 illustrates a plano-convex lens in which a light incidence surface 8A oriented to the inside of the case 7 is a plane surface and a light emission surface 8B oriented to the outside of the case 7 is a convex surface. The headlight 2 has a structure in which the projection lens 8 is fixed to the one end portion in the axial direction so as to close the opening of the case 7 and the light source module 10 is fixed to a wall surface (bottom surface) of the case 7 that faces the projection lens 8.

The light source module 10 includes a secondary wiring substrate 11 on which the primary wiring substrate 20 is mounted, and is fixed to the wall surface of the case 7 using fastening members 9 such as a bolt and a nut. A plurality of through-holes 18 for attaching the fastening members 9 are disposed on the secondary wiring substrate 11. To the plurality of light sources 41 constituting the light source array 40, electric power is supplied from the battery 3, by the drive circuit 6. The drive circuit 6 includes a plurality of switching elements corresponding to the light sources 41, and can independently perform the lighting control of the individual light sources 41.

Figure 3:
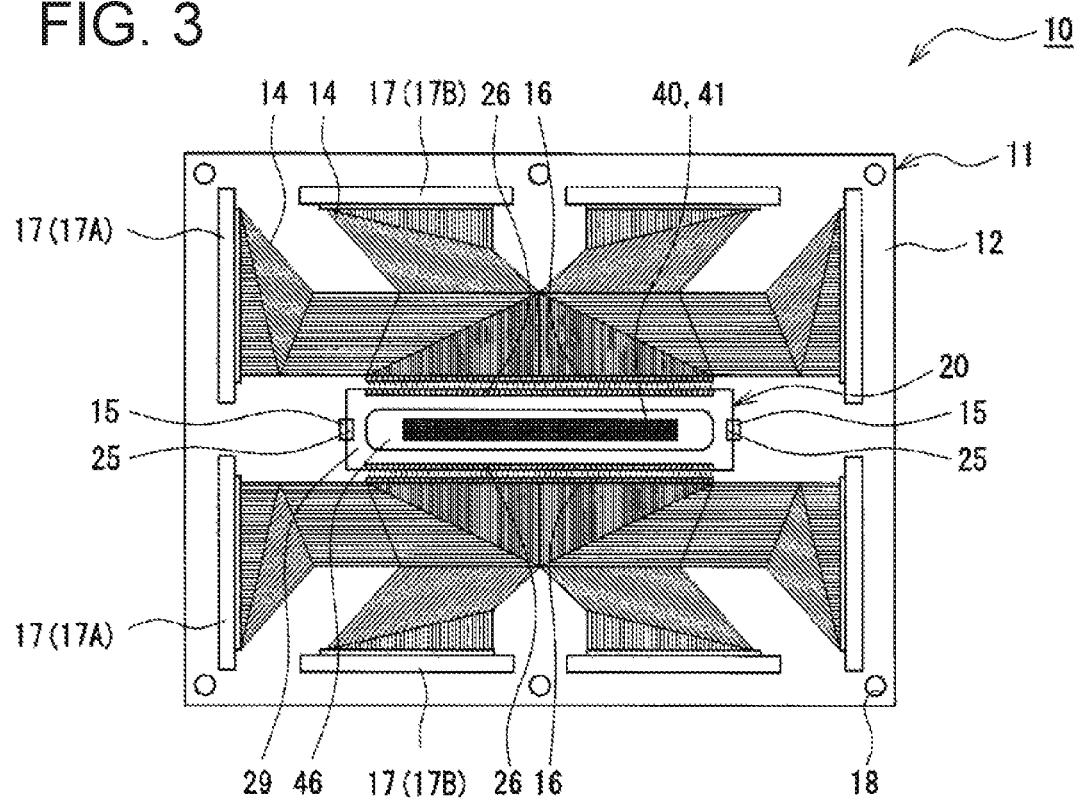
FIG. 3 is a plan view of a light source module according to an exemplary embodiment.

The light source array 40 of the light source module 10 is configured such that the plurality of light sources 41 are arrayed in a matrix, and has a planar-view band shape in which the length in the row direction is longer than the length in the column direction (see FIG. 3). It is desired that the headlight 2 of the automobile 1 can radiate light more widely in the horizontal direction than in the vertical direction. Therefore, the light source module 10 is fixed in the case 7 such that the longer direction (row direction) of the light source array 40 is along the horizontal direction.

The structure of the headlight 2 is not limited to the structure illustrated in FIG. 2, For example, the light source module 10 may be fixed to the case 7, through an attachment member to which the secondary wiring substrate 11 is fixed. Further, in the case 7, there may be provided a reflector that reflects the light of the light source module 10 to the side of the projection lens 8.

FIG. 3 is a plan view of the light source module 10 according to an exemplary embodiment. As illustrated in FIG. 3, the light source module 10 includes the secondary wiring substrate 11, and the primary wiring substrate 20 mounted on the secondary wiring substrate 11. As described above, the light source array 40 is mounted on the primary wiring substrate 20. Preferably, the light source array 40 should be configured such that many light sources 41 are arrayed in a matrix and in a high density. Meanwhile, in the light source module 10, for a configuration in which the plurality of light sources 41 can be individually controlled to be lit, it is necessary to form the same number of second electric supply wires 24 (see FIG. 5 and the like) as the number of the light sources 41, on the primary wiring substrate 20. As described later in detail, the light source module 10 has a structure in which the plurality of light sources 41 can be individually controlled to be lit and in which the plurality of light sources 41 are arrayed in a matrix and in a high density.

Both the secondary wiring substrate 11 and the primary wiring substrate 20 have planar-view rectangular shapes. The primary wiring substrate 20 is shorter than the secondary wiring substrate 11 in the lengths of the longer side and the shorter side, and is thinner than the secondary wiring substrate 11. The primary wiring substrate 20 is arranged at a central portion of the secondary wiring substrate 11, such that the longer sides of the substrates are nearly parallel to each other and the shorter sides of the substrates are nearly parallel to each other. The primary wiring substrate 20 may be soldered to the surface of the secondary wiring substrate 11, or may be bonded using an adhesive. The planar-view shapes of the substrates are not limited to rectangular shapes, and may be square shapes.

The secondary wiring substrate 11 includes a base substrate 12 having a planar-view rectangular shape, electric supply wires 14 disposed on the surface side of the lease substrate 12, and connectors 17 to which the electric supply wires 14 are connected. The plurality of through-holes 18 are formed on the secondary wiring substrate 11. The base substrate 12 is a parent material of the secondary wiring substrate 11, and functions as a support for the electric supply wires 14 and the like.

As the base substrate 12, for example, a metal substrate, a semiconductor substrate, a ceramic substrate, a resin substrate or the like is used. In the case of using a conductive substrate, it is necessary to provide an insulating layer between the surface of the substrate and the electric supply wires 14. For example, the electric supply wires 14 are composed of a metal containing aluminum, copper, tungsten, silver, gold or the like as the primary component. Preferably, aluminum or copper should be used, in consideration of conductivity, material cost and the like.

The secondary wiring substrate 11 includes electric supply pads that are disposed around the primary wiring substrate 20. The electric supply pads include secondary-substrate-side first electric supply pads 15 that are electrically connected with first electric supply pads 25 of the primary wiring substrate 20, and secondary-substrate-side second electric supply pads 16 that are electrically connected with second electric supply pads 26 of the primary wiring substrate 20. For example, each electric supply pad is composed of the same metal as the electric supply wire 14.

The electric supply pads of the secondary wiring substrate 11 are connected with the electric supply pads of the primary wiring substrate 20, for example, through metal wires of gold or the like. The number of the disposed electric supply pads of the secondary wiring substrate 11 is the same as the number of the corresponding electric supply pads of the primary wiring substrate 20. The first electric supply pads 25 of the primary wiring substrate 20 are formed at both longer-directional end portions of the primary wiring substrate 20, respectively, and therefore, the secondary-substrate-side first electric supply pads 15 are formed at vicinities of both longer-directional end portions of the primary wiring substrate 20, respectively.

On the other hand, the plurality of second electric supply pads 26 of the primary wiring substrate 20 are formed at both shorter-directional end portions of the primary wiring substrate 20, and therefore, the secondary-substrate-side second electric supply pads 16 are formed at vicinities of both shorter-directional end portions of the primary wiring substrate 20, respectively. On the secondary wiring substrate 11, there are formed two arrays (hereinafter, referred to as "arrays R(16)") each of which is formed by arraying a plurality of secondary-substrate-side second electric supply pads 16 on a line along the longer direction of the primary wiring substrate 20, such that the primary wiring substrate 20 is sandwiched from both shorter-directional ends.

In the light source module 10, the plurality of connectors 17 are arranged so as to surround the primary wiring substrate 20 that is mounted at the central portion of the secondary wiring substrate 11. Specifically, two connectors 17 are arranged at each of both longer-directional end portions of the secondary wiring substrate 11, along the shorter direction, and two connectors 17 are disposed at each of both shorter-directional end portions, along the longer direction, so that a total of eight connectors 17 are arranged. Hereinafter, the connectors 17 arranged at both longer-directional end portions of the secondary wiring substrate 11 are referred to as "connectors 17A", and the connectors 17 arranged at both shorter-directional end portions are referred to as "connectors 17B".

The electric supply wires 14 are wires that connect the plurality of secondary-substrate-side second electric supply pads 16 and terminals (not illustrated) of the plurality of connectors 17 with each other, and extend from vicinities of both shorter-directional end portions of the primary wiring substrate 20, in the four directions of the secondary wiring substrate 11. The number of the formed electric supply wires 14 is the same as the number of the secondary-substrate-side second electric supply pads 16. Each of the plurality of electric supply wires 14 is a wire for supplying electricity to the second electric supply pad 26 of the primary wiring substrate 20 through the secondary-substrate-side second electric supply pad 16, and functions also as a heat transfer path for radiating the heat of the light source array 40 in the four directions of the secondary wiring substrate 11.

The plurality of electric supply wires 14 connect the secondary-substrate-side second electric supply pads 16 and the terminals of the connectors 17 by one-to-one correspondence. For example, a plurality of electric supply wires 14 extending from two adjacent connectors 17A, 17B are respectively connected with secondary-substrate-side second electric supply pads 16 that constitute half of an array R(16) near the two connectors. The plurality of electric supply wires 14 extending from the connector 17A and the plurality of electric supply wires 14 extending frons the connector 17B are formed to be laminated with insulating layers in the thickness direction of the secondary wiring substrate 11, and are alternately connected with the secondary-substrate-side second electric supply pads 16.

As described later in detail, on the primary wiring substrate 20, the light source array 40 is mounted at the center of the substrate, and a light-blocking member 46 is provided around the light source array 40. Further, the surface of the primary wiring substrate 20 is covered with an insulating layer 29, except portions corresponding to electrodes of the electric supply pads and the light sources 41.

Figure 4:
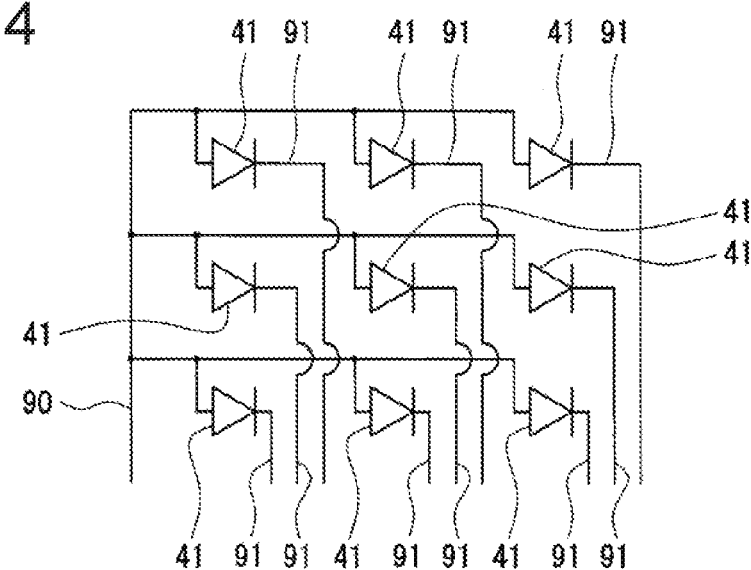
FIG. 4 is a circuit diagram of the light source module according to the exemplary embodiment.

FIG. 4 is a circuit diagram of the light source module 10. As illustrated in FIG. 4, the plurality of light sources 41 are connected with a plus-side wire 90 that is common among the light sources 41 and a plurality of minus-side wires 91 that are independent of each other. That is, the light source module 10 is provided with the same number of minus-side wires 91 as the number of the plurality of light sources 41 that constitute the light source array 40. Alternatively, a minus-side wire may be provided as a common wire, and the same number of plus-side wires as the number of the light sources 41 may be provided.

Here, the plus-side wire 90 of the light source module 10 is constituted by a first electric supply wire 23 (see FIG. 5), the first electric supply pad 25, a metal wire, the secondary-substrate-side first electric supply pad 15 and the like of the primary wiring substrate 20. The minus-side wire 91 is constituted by a second electric supply wire 24 (see FIG. 5), the second electric supply pad 26, a metal wire, the secondary-substrate-side second electric supply pad 16, the electric supply wire 14, the connector 17 and the like of the primary wiring substrate 20.

Since the light source module 10 is provided with the same number of minus-side wires 91 constituted by the second electric supply wire 24 and the like as the number of the light sources 41, it is possible to individually perform the lighting control of the plurality of light sources 41. The secondary-substrate-side first electric supply pads 15 and the terminals of the connectors 17 are connected with the drive circuit 6 that includes the plurality of switching elements corresponding to the light sources 41. By the drive circuit 6, the light sources 41 are turned on/off, independently of each other, and the light modulation and the color toning are performed. The drive circuit 6 may control the individual light sources 41, based on the detection information of various sensors that are mounted on the automobile 1.

Figure 5:
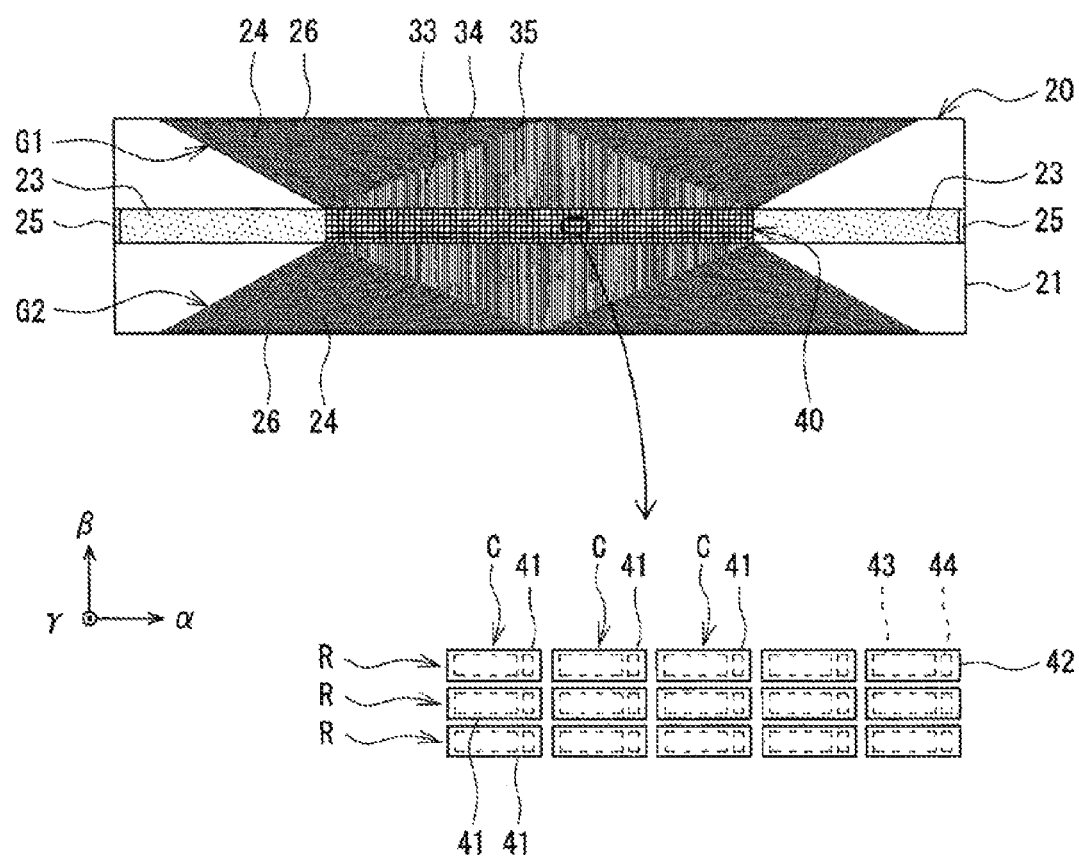
FIG. 5 is a plan view of a primary wiring substrate of the light source module according to the exemplary embodiment and a light source array mounted on a surface of the substrate (an insulating layer and a light-blocking member are not illustrated)

In the following, the configuration of the primary wiring substrate 20 and the light source array 40 will be described in detail, with reference to FIG. 5 to FIG. 7. FIG. 5 is a plan view showing the primary wiring substrate 20 and the light source array 40 mounted on the substrate, and shows a state in which the insulating layer 29 and the light-blocking member 46 are removed. In FIG. 5 and the like, reference character α denotes the row direction along the rows of the light sources 41, reference character β denotes the column direction along the columns of the light sources 41, and reference character γ denotes the thickness direction of the primary wiring substrate 20.

As illustrated in FIG. 5, the light source module 10 includes the primary wiring substrate 20 and the light source array 40 including the plurality of light sources 41 that are arranged on the first surface of the substrate in a matrix. The light source module 10 includes a set of light sources 41 arranged in the row direction and a set of light sources 41 arranged in the column direction. The plurality of light sources 41 constituting the light source array 40 include first electrodes 43 (first electric supply pads) and second electrodes 44 (second electric supply pads) respectively, and can be individually controlled to be lit. The light source array 40 includes a plurality of rows R of the light source 41 each of which is constituted by a plurality of light sources 41, and a plurality of columns C of the light source 41 each of which is constituted by a plurality of light sources 41. In the example shown in FIG. 5, more light sources 41 may be arranged along the row direction than along the column direction, and the number of the light sources 41 along the row direction may be the same as the number of the light sources 41 along the column direction.

In the embodiment, an array that is of an array of light sources 41 extending in a first direction and an array of the light sources 41 extending in a second direction and that is constituted by a larger number of light sources 41 is referred to as a "row R", and an array that is constituted by a smaller number of light sources 41 is referred to as a "column C". Here, the "row" may be referred to as a first array, and the "column" may be referred to as a second array. The "row direction" is a direction along the row R, the "column direction" is a direction along the column C, and the row direction and the column direction are orthogonal to each other.

The light source module 10 includes a first electric supply wire 23 for supplying electricity to each of the first electrodes 43 of the light sources 41 and a plurality of second electric supply wires 24 for supplying electricity to the second electrodes 44 of the light sources 41 respectively. Each of the first electric, supply wire 23 and the second electric supply wire 24 is provided so as to extend along the column C of the light sources 41 (the column direction), and the second electric supply wire 24 is disposed closer to a second surface (the second surface being located opposite of the first surface) of the primary wiring substrate 20 than the first electric supply wire 23. Here, each electric supply wire functions as a heat transfer path for diffusing heat to the light sources 41.

As described later in detail, at least one of a plurality of second electric supply wires 24 to be connected with identical-column light sources 41 which is the set of light sources 41 arranged in a column direction respectively is provided so as to extend through regions 36 that overlap with the first electrodes 43 of one or a plurality of identical-column light sources 41 in the thickness direction of the primary wiring substrate 20. At least one of the plurality of second electric supply wires 24 overlaps, in the thickness direction, light sources 41 among the set of light sources 41 arranged in the column direction (the identical-column light sources 41). Regions 36 of the light sources 41 overlapped by the at least one of the plurality of second electric supply wires 24 overlap one or more first electric supply pads 43 of one or more of the light sources 41 among the identical-column light sources 41. Here, the identical-column light sources 41 mean light sources 41 that constitute an identical column C. In the light source module 10, many light sources 41 can be arrayed not only in the row direction but also in the column direction. The number of identical-column light sources 41 is not particularly limited, and preferably, three or more identical-column light sources should be provided.

The light source module 10 includes an electric supply pad that is provided at a peripheral portion of the primary wiring substrate 20. The electric supply pad includes two first electric supply pads 25 that are electrically connected with the secondary-substrate-side first electric supply pad 15 through metal wires, and a plurality of second electric supply pads 26 that are electrically connected with the secondary-substrate-side second electric supply pad 16 through metal wires. The first electric supply wire 23, which is a common wire among the light sources 41, is connected with the two first electric supply pads 25. On the other hand, the plurality of second electric supply wires 24, which are independent among the light sources 41, are connected with the plurality of the second electric supply pads 26, by one-to-one correspondence.

Preferably, the primary wiring substrate 20 should be a long substrate that extends in the row direction. By using a substrate corresponding to the shape of the light source array 40, it is possible to efficiently arrange the second electric supply wires 24 and the like, for example. An example of the primary wiring substrate 20 is a substrate having a thickness of about 0.1 mm to 2 mm. As the substrate on which the light source array 40 is mounted, a block substrate may be used. In the light source array 40, the length in the row direction is longer than the length in the column direction, the row direction is the longer direction and the column direction is the shorter direction.

Each of the primary wiring substrate 20 and the light source array 40 has a planar-view rectangular shape. For example, the light source array 40 is arranged at a central portion of the primary wiring substrate 20, such that the longer sides of the primary wiring substrate 20 and the light source array 40 are nearly parallel to each other and the shorter sides of the primary wiring substrate 20 and the light source array 40 are nearly parallel to each other. The light source array 40 is shorter than the primary wiring substrate 20 in the lengths of the longer side and the shorter side. The light source array 40 has a thinner shape than the primary wiring substrate 20, and has a planar-view hand shape. In the embodiment, the row direction is the same as the longer direction of the primary wiring substrate 20, and the column direction is the same as the shorter direction of the primary wiring substrate 20.

In the light source array 40, the lengths of the rows R are the same as each other, and the lengths of the columns C are the same as each other. The number of the light sources 41 constituting each row R is 10 to 100, for example, and is the same among the rows R. The number of the light sources 41 constituting each of the columns C (identical-column light sources 41) is 3 to 30, for example, and is the same among the columns C. Here, the number of light sources 41 does not need to be the same among the rows R or the columns C. In the headlight 2, preferably, the light source array 40 should be formed to have a long thin shape, and the light source module 10 should be arranged such that the longer direction is along the horizontal direction. For example, in a light source module that is applied to another use purpose, the number of the light sources 41 in the row direction and the number of the light sources 41 in the column direction may be the same as each other.

In each of the plurality of light sources 41 constituting the light source array 40, preferably, the length in the row direction should be longer than the length in the column direction. In other words, preferably, each light source 41 should be arranged such that the longer direction is along the row direction. Each light source 41 has a planar-view rectangular shape, for example. By matching the longer direction of each light source 41 with the row direction in which more light sources 41 are arrayed, a formation space for the second electric supply wire 24 is easily secured, for example, under (on the rear side of) the light sources 41 allowing a high-density arrangement of the light sources 41. This point will be described further later.

Each of the plurality of light sources 41 includes a light-emitting portion 42, a first electrode 43 and a second electrode 44. The light-emitting portion 42 has a structure in which a gallium nitride compound semiconductor layer containing a p-n junction is formed on a substrate such as a sapphire substrate, a spinel substrate, a gallium nitride substrate, a zinc carbide substrate and a silicon carbide, for example. In the embodiment, the first electrode 43 and the second electrode 44 are disposed on one surface of the light-emitting portion 42. The first electrode 43 is a p-electrode (anode electrode), and the second electrode 44 is an n-electrode (cathode electrode).

The first electrode 43 of each light source 41 is longer than the second electrode 44 in row-directional length. The first electrode 43 and the second electrode 44 are disposed to have planar-view rectangular shapes, for example, and the first electrode 43 is formed to be larger than the second electrode 44. The first electrode 43 is formed to be long in the longer direction of the light source 41, and the light source 41 is arranged such that the longer side direction of the first electrode 43 is along the row direction. The column directional length of the first electrode 43 may be equivalent to the column-directional length of the second electrode 44, The longer side direction of the second electrode 44 may be along the column direction.

For example, the row-directional length of the first electrode 43 is 2 to 10 times the row-directional length of the second electrode 44. Preferably, the first electrode 43 should be formed to be long in the row direction, in a range that does not obstruct the electric connection between the second electrode 44 and the first electric supply wire 23, and the like, and may be formed to have a length of 50% to 80% of the row-directional length of the light source 41. In the light source module 10, the plurality of second electric supply wires 24 are formed to pass through the region 36 immediately below the first electrode 43, and therefore, preferably, the space for the second electric supply wires 24 should be increased by increasing the row-directional length of the first electrode 43.

As described above, the first electric supply pads 25 are electrically connected with the secondary-substrate-side first electric supply pad 15 through the metal wires. The first electric supply pads 25 are thrilled at both longer-directional end portions of the primary wiring substrate 20, along the shorter side of the primary wiring substrate 20. The length of each first electric supply pad 25 may be shorter than the length of the shorter side of the primary wiring substrate 20, and for example, may be equivalent to the column-directional length of the light source array 40. Preferably, the first electric supply pads 25 should be formed to be arrayed with the light source array 40 in the longer direction of the primary wiring substrate 20.

The first electric supply wire 23 connects the first electrode 43 of each light source 41 of the light source array 40 and the two first electric supply pads 25. Preferably, the first electric supply wire 23 should be linearly formed from both row-directional end portions of the light source array 40 along the row direction (the longer direction of the primary wiring substrate 20). The two first electric supply pads 25 are formed to be arrayed with the light source array 40 in the longer direction of the primary wiring substrate 20, and therefore, by linearly forming the first electric supply wire 23, it is possible to connect the light source array 40 and the first electric supply pads 25 by the shortest way. In this case, it is possible to efficiently radiate the heat of the light source array 40 through the first electric supply wire 23.

As described above, the plurality of second electric supply pads 26 are connected with the plurality of secondary-substrate-side second electric supply pads 16 through the metal wires, by one-to-one correspondence. The plurality of second electric supply pads 26 are formed at both shorter-directional end portions of the primary wiring substrate 20, respectively, Each second electric supply pad 26 has a planar-view square shape, for example.

On the primary wiring, substrate 20, two arrays (hereinafter, referred to as "arrays R(26)") each of which is formed by arraying a plurality of second electric supply pads 26 on a line are formed along the longer direction of the substrate. Between the two arrays R(26), for example, the number of the second electric supply pads 26 is the same, and the interval between the second electric supply pads 26 is nearly the same.

The array R(26) of the second electric supply pads 26 is longer than the row-directional length of the light source array 40, and extends beyond positions corresponding to both row-directional ends of the light source array 40 to both longer-directional end sides of the primary wiring substrate 20. That is, the plurality of second electric supply pads 26 are formed to be longer in the longer direction of the primary wiring substrate 20 than the interval between the two light sources 41 that are arranged at both ends of the row R. In this case, the connection between the second electric supply pad 26 and the secondary-substrate-side second electric supply pad 16 becomes easy, and the heat of each light source 41 is easily diffused over a wide range of the primary wiring substrate 20, so that the heat radiation is enhanced.

The array R(26) of the second electric supply pads 26 may be formed over the entire longer-directional length of the primary wiring substrate 20, and for example, is formed to have a length of 1.5 to 3 times the longer-directional length of the light source array 40. Further, the second electric supply pads 26 may be formed along the shorter side of the primary wiring substrate 20, without contacting with the first electric supply pads 25.

The plurality of second electric supply wires 24 connect the second electrodes 44 of the light sources 41 of the light source array 40 and the plurality of second electric supply pads 26, by one-to-one correspondence. The plurality of second electric supply wires 24 are provided so as to extend from both column-directional end portions (both shorter-directional end portions) of the light source array 40 to both shorter-directional end portions of the primary wiring substrate 20, respectively. Since the plurality of second electric supply wires 24 extend to both ends of the light source array 40 in this way, the wiring space is easily secured, and the light sources 41 are easily secured densely. Further, the heat radiation of the light source array 40 is enhanced.

Preferably, each of groups G1, G2 of second electric supply wires 24 to be formed on both column-directional sides of the light source array 40 should be constituted by the same number of second electric supply wires 24 as half the number of the plurality of light sources 41 constituting the light source array 40.

Each of the groups G1, G2 of the second electric supply wires 24 broadens gradually as it extends from both column-directional end portions of the light source array 40 to both shorter-directional ends of the primary wiring substrate 20, and is formed to have a planar-view trapezoidal shape. Since the array R(26) of the second electric supply pads 26 extends beyond the positions corresponding to both row-directional ends of the light source array 40 to both longer-directional end sides of the primary wiring substrate 20, each of the groups G1, G2 of the second electric supply wires 24 has a shape of broadening in the longer direction of the substrate with distance from the light source array 40. In this case, the heat of each light source 41 is easily diffused over a wide range of the primary wiring substrate 20, so that the heat radiation is enhanced.

Preferably, the plurality of second electric supply wires 24 should include first linear portions 33 that extend from the column-directional end portions of the light source array 40, and second linear portions 34 that are connected with the first linear portions 33. At least one of light sources 41 arranged at a row-directional central portion of the light source array 40 may be connected with the second electric supply pad 26, by the shortest way, through a second electric supply wire 24 configured by only the first linear portion 33. Further, at least one of light sources 41 arranged at both longer-directional end portions of the light source array 40 is connected with the second electric supply pad 26, through a second electric supply wire 24 configured by only the second linear portion 34.

The light sources 41 arranged at the row-directional central portion of the light source array 40 are likely to have high temperatures because of being surrounded by many light sources 41. However, since the light sources 41 are connected with the second electric supply pads 26 at the first linear portions 33 that extend along the column direction, it is possible to efficiently radiate the heat of the light sources 41, and to suppress the rise in the temperature.

Preferably, the plurality of second electric supply wires 24 should be formed such that the inclination direction of the second linear portion 34 changes at the row-directional center of the light source array 40. In the plurality of second electric supply wires 24, preferably, the first linear portions 33 should be formed to be nearly parallel to each other, and the second linear portions 34 extending in the same direction should be formed to be nearly parallel to each other.

The plurality of second electric supply wires 24 including the first linear portions 33 and the second linear portions 34 are formed such that the length of the first linear portion 33 is longer and the length of the second linear portion 34 is shorter as the position is closer to the row-directional center of the light source array 40 from both row-directional ends. A connection portion 35 between the first linear portion 33 and the second linear portion 34 is formed to be closer to the light source array 40 as the position is closer to both row-directional ends of the light source array 40 from the row-directional center, and a virtual line joining connection portions 35 is a straight line.

Figure 6:
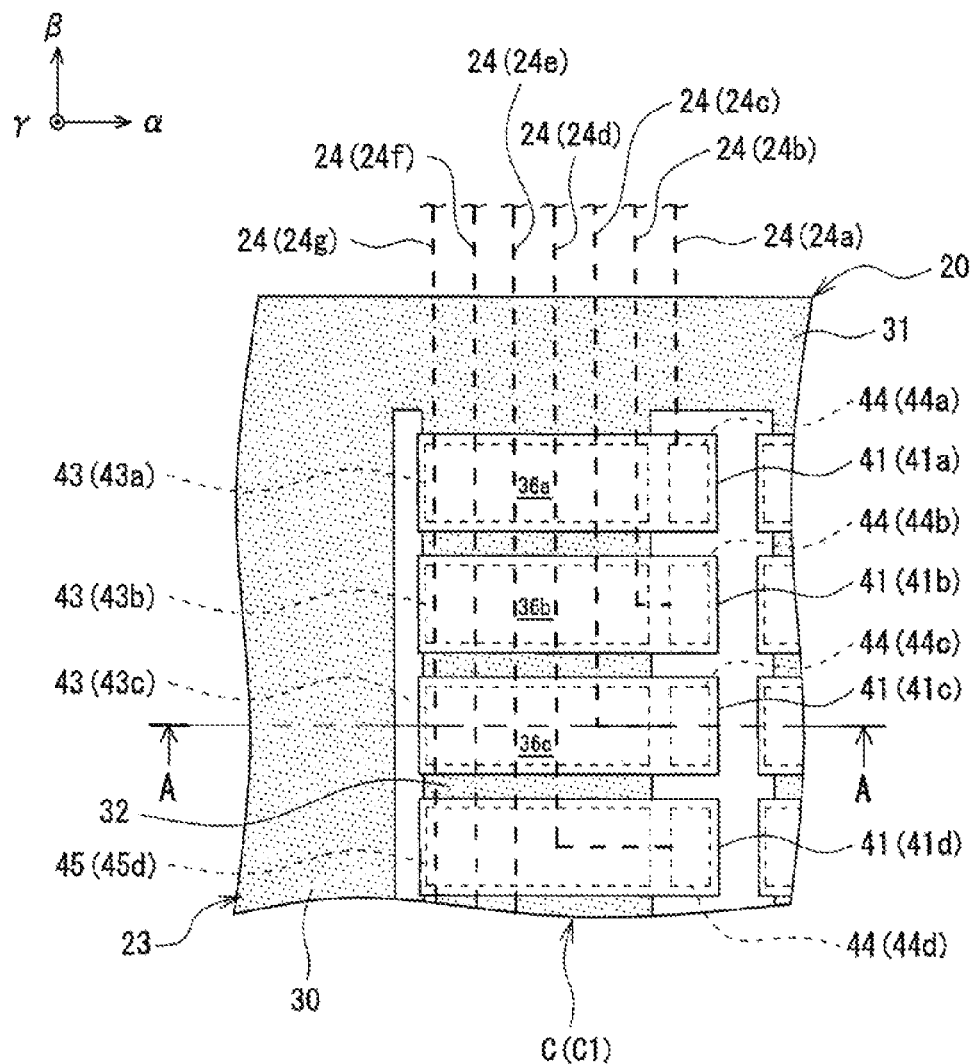
FIG. 6 is an enlarged view showing a part of FIG. 5.

FIG. 6 is an enlarged view showing a part of FIG. 5 (the insulating layer 29 and the light-blocking member 46 are not illustrated). FIG. 7 is a diagram showing a part of a section taken from line AA in FIG. 6. As illustrated in FIG. 6 and FIG. 7, the light sources 41 constituting the light source array 40 are connected with the first electric supply wire 23 that is common among the light sources 41 and the plurality of second electric supply wires 24 that are independent of each other. The single continuous first electric supply wire 23 is connected with all first electrodes 43 of the light sources 41, and on the other hand, the second electric supply wires 24 are connected with the second electrodes 44 of the light sources 41 in one-to-one correspondence.

Figure 7:
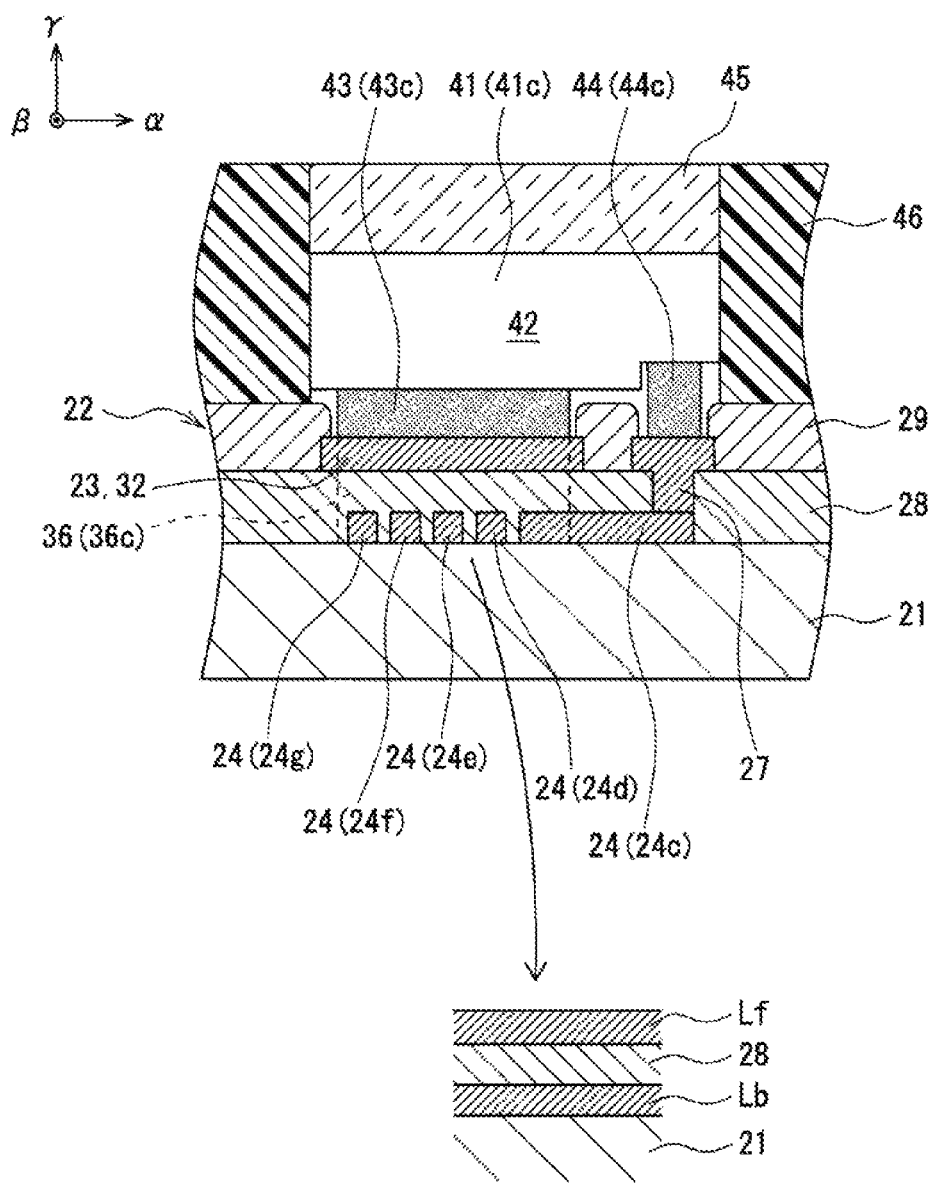
FIG. 7 is a diagram showing a part of a section taken from line AA in FIG. 6.

In the embodiment, the plurality of second electric supply wires 24 are disposed closer to the second side of the primary wiring substrate 20 than the first electric supply wire 23, and the second electric supply wires 24 are electrically connected with the second electrodes 44 of the light sources 41 through interlayer conducting paths 27 (see FIG. 7). The plurality of interlayer conducting paths 27 connect the second electric supply wires 24 and the second electrodes 44 of the light sources 41, in one-to-one correspondence. That is, the number of the formed interlayer conducting paths 27 is the same as the number of the light sources 41.

As illustrated in FIG. 7, the primary wiring substrate 20 includes a base substrate 21 and a wiring layer 22 formed on the surface of the base substrate 21. The plurality of light sources 41 constituting the light source array 40 are mounted on the surface of the wiring layer 22. The base substrate 21 is a parent material of the primary wiring substrate 20, and functions as a support for the wiring layer 22.

Similarly to the base substrate 12 of the secondary wiring substrate 11, the base substrate 21 may be constituted by a metal substrate, a semiconductor substrate, a ceramic substrate, a resin substrate or the like. For example, the first electric supply wire 23, the second electric supply wire 24 and the interlayer conducting path 27 are composed of a metal containing aluminum, copper, tungsten, silver, gold or the like as the primary component. Preferably, aluminum or copper should be used, in consideration of conductivity, material cost and the like.

The wiring layer 22 includes the first electric supply wire 23, the plurality of second electric supply wires 24, and an insulating layer 28 for insulating the electric supply wires. The wiring layer 22 is formed by laminating the plurality of second electric supply wires 24, the insulating layer 28 and the first electric supply wire 23 in the order from the base substrate 21. Further, in the wiring layer 22, there is formed the interlayer conducting path 27 connected with the second electric supply wire 24 while piercing the insulating layer 28.

Preferably, the wiring layer 22 includes a second metal layer Lb that includes the plurality of second electric supply wires 24 formed on the front surface side of the base substrate 21, the insulating layer 28 that is formed on the second metal layer, and a first metal layer Lf that contains the first electric supply wire 23 formed on the insulating layer 28. The first electric supply wire 23 is constituted by the first metal layer Lf, and the plurality of second electric supply wires 24 are constituted by the second metal layer Lb. Further, a surface layer portion of the interlayer conducting path 27 to be connected with the second electrode 44 of the light source 41 is constituted by the first metal layer Lf.

The second metal layer Lb can be formed on the surface of the base substrate 21, by CVD, sputtering, vapor deposition, plating or the like. The first metal layer Lf can be formed in the same method. Preferably, the plurality of second electric supply wires 24 should be formed by the patterning of the second metal layer Lb. The pattern of the electric supply wires can be formed by the printing of a conductive ink. The insulating layer 28 is formed on the surface of the second metal layer Lb after patterning, that is, on the surface of the second electric supply wire 24, and a part of the insulating layer 28 is formed on the surface of the base substrate 21 that is exposed by the removal of the second metal layer Lb. The insulating layer 28, for example, is composed of an insulating metal compound that contains silicon oxide or the like as the primary component, and is formed by CVD.

The first metal layer Lf is formed on the surface of the insulating layer 28, after removing, by etching, portions of the insulating layer 28 where the interlayer conducting paths 27 are funned, that is, after forming opening portions for exposing parts of the second electric supply wires 24. On this occasion, the metal layer is also deposited on the opening portions and the exposed parts of the second electric supply wires 24. Preferably, the first electric supply wire 23 and the interlayer conducting paths 27 that are separated from each other should be formed by the patterning of the first metal layer Lf. Each electric supply pad can be formed by depositing a metal layer at the end portion of the corresponding electric supply wire by plating or the like.

For forming the plurality of second electric supply wires 24, the wiring layer 22 can be formed as a multi-layer structure in which insulating layers and metal layers are alternately laminated. However, from a standpoint of productivity or the like, preferably, the plurality of second electric supply wires 24 should be formed by a single metal layer. In the embodiment, all second electric supply wires 24 are formed on an identical plane, by the patterning of the second metal layer Lb. As described later, by improving the formation pattern of the second electric supply wires 24 that pass through the rear sides of the light sources 41, it is possible to form many second electric supply wires 24 even in the above three-layer structure.

On the outermost surface of the wiring layer 22, the insulating layer 29 may be formed at the region other than portions corresponding to the electric supply pads and the electrodes of the light sources 41. The insulating layer 29 has a function to cover and protect the surface of the first electric supply wire 23. The insulating layer 29 may be composed of a photosensitive resin that is used as a photoresist. In the case where a conductive substrate such as a semiconductor substrate is used as the base substrate 21, it is necessary to provide an insulating layer for insulating the base substrate 21 and the second electric supply wire 24.

The light source module 10 may include a transparent cover 45 that covers each of the surfaces of the light-emitting portions 42 of the light sources 41. The light source 41 that is an LED emits white light, for example, by converting part of blue, light of the light source 41 into light having a long wavelength, using a fluorescent substance, and mixing the light with the other part of the blue light. An example of the transparent cover 45 is a ceramic containing a fluorescent substance, and may be a glass containing a fluorescent substance. The transparent cover 45 has a function to convert the wavelength of the light of the light source 41 and to protect the light source 41.

The light source module 10 may include the light-blocking member 46 that is provided around the light source array 40 so as to surround the four sides of the light source array 40 and that is filled into the gaps among the light sources 41. The light-blocking member 46 covers each side surface of the light-emitting portions 42 and the transparent cover 45, and prevents the light of each light sources 41 from being emitted in the planar direction of the primary wiring substrate 20. The light-blocking member 46 has a function to reflect the light of the light source 41. For the light-blocking member 46, for example, a silicone resin containing a white pigment is used.

As illustrated in FIG. 6, the first electric supply wire 23 includes a first principal portion 30 that is formed from a row-directional end portion of the light source array 40 (the end portion of the set of light sources 41 arranged in the row direction) along the row direction, and two second principal portions 31 that are formed on both shorter-directional sides of the light source array 40 so as to sandwich the light source array 40. In the embodiment, first principal portions 30 are linearly formed from both row-directional end portions of the light source array 40 toward the two first electric supply pads 25, respectively. The two second principal portions 31 are connected with the first principal portions 30 that are formed on both row-directional sides of the light source array 40. Two second principal portions 31 are joined to both ends of the first principal portion 30 in the column direction to sandwich a light source 41 disposed between the two second principal portions 31.

The first electric supply wire 23 includes a plurality of branching portions 32 that are formed along the columns C of the light sources 41 so as to branch from the second principal portion 31, respectively. The number of the formed branching portions 32 is the same as the number of the columns C of the light sources 41. The plurality of branching portions 32 are formed along the column direction, in nearly parallel to each other. Each of the plurality of branching portions 32 is formed over the entire length of the column C, that is, over the set of light sources 41 arranged in the row direction, preferably, over the two second principal portions 31.

Each branching portion 32 which is common wire is connected with all first electrodes 43 of the light sources 41 constituting the column C. That is, the plurality of light sources 41 are arranged along the branching portions 32 formed on the primary wiring substrate 20, and thereby, the plurality of columns C are formed. The branching portion 32 is a common wire that is shared by the identical-column light sources 41. To the branching portion 32, the first electrode 43 may be bonded using a metal bump or a conductive adhesive, or may be soldered. The branching portion 32 is formed to be wider than the row-directional length of the first electrode 43, in order to avoid the first electrode 43 from protruding out of the branching portion 32. Preferably, the branching portion. 32 should be formed in the range of the row-directional length of the light source 41, so as not to interfere with the adjacent column C.

Each of the first principal portion 30, the second principal portion 31 and the branching portion 32 is formed to have a planar-view band shape. The first principal portion 30 has the greatest width, and the second principal portion 31 has the second greatest width. For example, the first principal portion 30 is termed to have a width equivalent to the column-directional length of the light source array 40 or a width equal to or greater than the column-directional length of the light source array 40. Particularly, a high electric current flows through the first principal portion 30, and therefore, preferably, the first principal portion 30 should be formed to have a wide width such that the heat generation is suppressed. Further, by forming the first principal portion 30 with a wide width, the heat radiation of the light source array 40 is enhanced.

The plurality of second electric supply wires 24 are formed on the rear side of the light source array 40, along the columns C of the light sources 41, respectively. As described above, the second electric supply wires 24 are formed closer to the rear side of the primary wiring substrate 20 than the first electric supply wire 23, and are connected with the second electrodes 44 of the light sources 41 through the interlayer conducting paths 27 (see FIG. 7), in one-to-one correspondence. The plurality of interlayer conducting paths 27 are formed immediately below the portions where the second electrodes 44 of the light sources 41 are arranged, respectively, and parts of the second electric supply wires 24 are formed immediately below the interlayer conducting paths 27, respectively. That is, the second electrodes 44, the interlayer conducting paths 27 and the second electric supply wires 24 are formed to overlap with each other in the thickness direction of the primary wiring substrate 20.

The surface layer portion of the interlayer conducting path 27 that is connected with the second electrode 44 is formed to be greater than the second electrode 44. To the surface layer portion of the interlayer conducting path 27, the second electrode 44 may be bonded using a metal bump or a conductive adhesive, or may be soldered.

In the following, description will be given on the assumption that the number of the identical-column light sources 41, which are the plurality of light sources 41 constituting an identical column, is fourteen. In FIG. 6, four identical-column light sources 41*a* to 41*d* of the fourteen identical-column light sources 41 constituting a column C1 are arranged at nearly equal intervals, along the shorter direction of the primary wiring substrate 20. In FIG. 6, second electric supply wires 24*e*, 24*f*, 24*g* are illustrated, but identical-column light sources 41*e*, 41*f*, 41*g* connected with these are not illustrated.

As described above, each of the plurality of light sources 41 constituting the light source array 40 is arranged such that the longer direction is along the row direction in which more light sources 41 are arrayed. That is, each light source 41 is arranged such that the longer direction is orthogonal to the plurality of second electric supply wires 24 formed along the column C. To array the light sources 41 densely, it is necessary to form fourteen second electric supply wires 24 to be connected with the fourteen identical-column light sources 41, in the range of a column C1, such that the second electric supply wires 24 do not interfere with the second electric supply wires 24 in the adjacent column C. Therefore, preferably, the longer direction of each light source 41 should be along the row direction for broadening the formation space for the second electric supply wires 24.

The plurality of second electric supply wires 24 to be connected with the identical-column light sources 41 are formed to be divided to both column-directional sides of the light source array 40, and the groups G1, G2 (see FIG. 5) of the second electric supply wires 24 are formed on both column-directional sides, respectively. For example, among the fourteen second electric supply wires 24 to be connected with the fourteen identical-column light sources 41, seven second electric supply wires 24*a* to 24*g* are provided so as to extend to one side in the column direction of the light source array 40, and the other seven are provided so as to extend to the other end in the column direction of the light source array 40.

As illustrated in FIG. 6 and FIG. 7, the plurality of second electric supply wires 24 to be connected with the identical-column light sources 41 should be provided so as to extend through regions 36 immediately below the first electrodes 43 of one or a plurality of identical-column light sources 41. As described above, the region 36 immediately below the first electrode 43 means a region that overlaps with the first electrode 43 in the thickness direction of the primary wiring substrate 20, on the rear side of the first electrode 43. The second electric supply wire 24*a* to be connected with the identical-column light source 41*a* positioned at an end of the column C1 is provided so as to extend to one side in the column direction of the light source array 40, without passing through the rear side of another light source 41.

For example, the second electric supply wire 24*h* to be connected with the identical-column light source 41*b* is provided so as to extend to one side in the column direction of the light source array 40, through the rear side of the identical-column light source 41*a*. The second electric supply wire 24*g* to be connected with the identical-column light source 41*g* is provided so as to extend to one side in the column direction of the light source array 40, through the rear sides of the six identical-column light sources 41*a* to 41*f*. The second electric supply wire 24*b* is formed at a region 36*a* immediately below a first electrode 43*a*, and the second electric supply wire 24*g* is formed at regions 36*a* to 36*f* immediately below first electrodes 43*a* to 43*f*.

In the case where the plurality of second electric supply wires 24 are formed by a small number of layers illustrated in FIG. 7, such as a three-layer structure, the second electric supply wires 24*a* to 24*f* exist in the same layer, on one side in the column direction of the second electric supply wire 24*g*. Therefore, it is difficult to extend the second electric supply wire 24*g* from immediately below a second electrode 44*g* along the column direction straight. The same goes for the second electric supply wire 24*b* to 24*f*. Thus, in the light source module 10, by forming the second electric supply wire 24 at the region 36 immediately below the identical-column light source 41, it is possible to prevent interference among the second electric supply wires 24, and to achieve a high-density arrangement of the light sources 41 without forming the primary wiring substrate 20 as multiple layers.

The regions 36 immediately below the first electrodes 43 of the identical-column light sources 41 are formed to be arrayed in the column direction, Therefore, a plurality of second electric supply wires 24 can be linearly formed to pass through the regions 36. For example, the fourteen second electric supply wires 24 respectively connected with the identical-column light sources 41 of the column C1 are formed in the range of the column without interfering with each other. In the light source module 10, the first electrode 43 is formed to be longer in the row direction than the second electrode 44, and the region 36 that is long in the row direction is secured. Therefore, it is possible to form many second electric supply wires 24 at the region 36.

Preferably, the plurality of second electric supply wires 24 are provided parallel to the column direction, at the regions 36 immediately below the first electrodes 43 of one or a plurality of identical-column light sources 41. In the example shown in FIG. 6, the six second electric supply wires 24*b* to 24*g* are provided parallel to the column direction, at the region 36*a* immediately below the identical-column light source 41*a*. At each region 36, preferably, the plurality of second electric supply wires 24 should be formed at nearly regular intervals nearly parallel to each other. The number of the second electric supply wires 24 passing through one region 36 is larger the closer the just-under region is to the end of the column C.

In the light source module 10, preferably, a vicinal wire that is of the second electric supply wires 24 passing through a region 36 and that is closest to the second electrode should be a wire that is connected with an adjacent light source 41 adjacent to the identical-column light source 41 corresponding to this region 36. For example, the wire that is of the second electric supply wires 24b to 24g passing through the region 36a and that is closest to the second electrode 44a is the second electric supply wire 24b that is connected with the identical-column light source 41b. By adopting such a wiring pattern, it is possible to prevent a plurality of second electric supply wires 24 that will be formed in the same layer from interfering with each other.

Some second electric supply wires 24 may be formed to protrude out of the region 36. However, preferably, the second electric supply wires 24 should be formed in the range of the column C along the column direction. Since the branching portion 32 of the first electric supply wire 23 is formed to be slightly longer in the row direction than the first electrode 43 in the range of the row-directional length of the light source 41, each second electric supply wire 24 may be formed to be contained in the immediately below region of the branching portion 32.

Thus, the light source module 10 including the above configuration includes the same number of second electric supply wires 24 as the number of the plurality of light sources 41 constituting the light source array 40, and therefore, allows individual lighting control of the light sources 41. Further, even though many second electric supply wires 24 are formed in the light source module 10, it is possible to design the light source array 40 in which the plurality of light sources 41 are arrayed in a matrix and in a high density. In the light source module 10, it is not necessary to form the primary wiring substrate 20 as multiple layers for forming the second electric supply wires 24, and it is possible to form the same number of second electric supply wires 24 as the light sources 41 in the same layer. According to the light source module 10, it is possible to array many light sources 41 in a high density, in both of the row direction and the column direction.

REFERENCE SIGNS LIST 1 automobile, 2 headlight, 3 battery, 4 vehicle body, S switch, 6 drive circuit, 7 case, 8 projection lens, 8A light incidence surface, 8B light emission surface, 9 fastening member, 10 light source module, 11 secondary wiring substrate, 12 base substrate, 14 electric supply wire, 15 secondary-substrate-side first electric supply pad, 16 secondary-substrate-side second electric supply pad, 17 connector, 18 through-hole, 20 primary wiring substrate, 21 base substrate, 22 wiring layer, 23 first electric supply wire, 24 second electric supply wire, 25 first electric supply pad, 26 second electric supply pad, 27 interlayer conducting path, 28, 29 insulating layer, 30 first principal portion, 31 second principal portion, 32 branching portion, 33 first linear portion, 34 second linear portion, 35 connection portion, 36 region, 40 light source array, 41 light source, 42 light-emitting portion, 43 first electrode, 44 second electrode, 45 transparent cover, 46 light-blocking member, 90 plus-side wire, 91 minus-side wire, R row, C column, G1, G2 group, Lf first metal layer, Lb second metal layer

The invention claimed is:

1. A light source module comprising:
a substrate;
a plurality of light sources
mounted on a first surface of the substrate in a thickness direction of the substrate, arranged in a matrix,
including a set of light sources arranged in a row direction and a set of light sources arranged in a column direction,
each of the plurality of light sources including a first electrode and a second electrode, the first electrode being longer than the second electrode in the row direction, and
the each of the plurality of light sources being configured to be individually controlled to be lit,
a first electric supply wire configured to supply electricity to each of the first electrodes, the first electric supply wire being provided to extend along the column direction, and
a plurality of second electric supply wires configured to supply electricity to each of the second electrodes, each of the plurality of second electric supply wires being provided to extend along the column direction closer to a second surface of the substrate than the first electric supply wire, the second surface being located opposite of the first surface,
wherein
at least one of the plurality of second electric supply wires overlaps, in the thickness direction, light sources among the set of light sources arranged in the column direction, and
at least one of the plurality of second electric supply wires that are connected to each of light sources of the set of light sources arranged in the column direction is provided so as to extend through regions, the regions overlapping with the first electrodes of one or a plurality of light sources of the set of light sources arranged in the column direction in the thickness direction of the substrate.

2. The light source module according to claim 1, wherein the set of light sources arranged in the column direction includes three or more light sources, and
the plurality of second electric supply wires extend parallel in the column direction, in at least one of the regions.

3. The light source module according to claim 2, wherein a second electric supply wire that is closest to a second electrode
is connected with an adjacent light source that is adjacent to the light sources corresponding to the regions, and
passes through one of the regions.

4. The light source module according to claim 2, wherein the plurality of second electric supply wires are spaced at regular intervals and are parallel to each other in at least one of the regions.

5. The light source module according to claim 2, wherein a number of the plurality of second electric supply wires passing in the column direction through one region of the regions in parallel is larger than another region of the regions.

6. The light source module according to claim 2, wherein the substrate is longer in the row direction than the column direction, and
the plurality of second electric supply wires are provided to extend from both end portions in the column direction to end sides of the substrate.

7. The light source module according to claim 1, wherein in each of the plurality of light sources, a length of a light source included the set of light sources arranged in the row direction is longer than a length of the light source in the column direction.

8. The light source module according to claim 1, wherein the first electric supply wire includes a common wire disposed over an entire length of the set of light sources arranged in the column direction, and the common wire is connected with all of the first electrodes of the light sources included in the set of light sources arranged in the column direction.

9. The light source module according to claim 8, wherein the first electric supply wire includes:

- a first principal portion disposed from an end portion of the set of light sources arranged in the row direction; and
- two second principal portions joined to both ends of the first principal portion in the column direction to sandwich a light source disposed between the two second principal portions, and a plurality of common wires is disposed along the set of light sources arranged in the column direction, each of the plurality of common wires branching from the two second principal portions.

10. The light source module according to claim 9, wherein each of the plurality of common wires is disposed between the two second principal portions.

11. The light source module according to claim 1, wherein the substrate includes a base substrate and a wiring layer disposed on a front surface of the base substrate, and the wiring layer includes:

a first metal layer disposed on the front surface of the base substrate, the first metal layer including the plurality of second electric supply wires;

an insulating layer disposed on the first metal layer; and a second metal layer disposed on the insulating layer, the second metal layer containing the first electric supply wire.

12. The light source module according to claim 11, wherein an interlayer conducting path is disposed in the wiring layer, the interlayer conducting path passes through the insulating layer and connects a second electrode with a second electric supply wire.

13. An illumination device comprising the light source module according to claim 1.

14. A moving body comprising the light source module according to claim 1.

15. The moving body according to claim 14 being a car.

16. The moving body according to claim 14 being a bike.

17. The moving body according to claim 14 being a train.

18. The moving body according to claim 14 being an air plane.

* * * * *